United States Patent
Yamagishi et al.

(10) Patent No.: US 7,695,889 B2
(45) Date of Patent: Apr. 13, 2010

(54) COPOLYMER FOR SEMICONDUCTOR LITHOGRAPHY AND PROCESS FOR PRODUCTION THEREOF

(75) Inventors: Takanori Yamagishi, Chiba (JP); Tomo Oikawa, Chiba (JP); Masaaki Muroi, Fukushima (JP); Kota Atsuchi, Kanagawa (JP); Takahiro Nakamura, Kanagawa (JP); Masakazu Yamada, Kanagawa (JP); Kensuke Saisyo, Kanagawa (JP); Masaru Takeshita, Kanagawa (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 913 days.

(21) Appl. No.: 11/430,738

(22) Filed: May 9, 2006

(65) Prior Publication Data

US 2006/0257784 A1 Nov. 16, 2006

(30) Foreign Application Priority Data

May 10, 2005 (JP) .............................. 2005-137557

(51) Int. Cl.
*G03F 7/00* (2006.01)
*G03F 7/004* (2006.01)
*C08F 2/00* (2006.01)

(52) U.S. Cl. ........................ 430/270.1; 526/75; 526/78; 526/79; 526/87

(58) Field of Classification Search .............. 430/270.1; 526/75, 78, 79, 87
See application file for complete search history.

(56) References Cited

U.S. PATENT DOCUMENTS

| | | | | |
|---|---|---|---|---|
| 4,342,676 A | * | 8/1982 | Ivanchev et al. | ............. 524/458 |
| 4,371,677 A | * | 2/1983 | Morningstar et al. | .......... 526/80 |
| 4,564,664 A | * | 1/1986 | Chang et al. | ................. 524/833 |
| 6,218,485 B1 | * | 4/2001 | Muramoto et al. | ............ 526/87 |
| 2001/0026901 A1 | * | 10/2001 | Maeda et al. | ............ 430/270.1 |

FOREIGN PATENT DOCUMENTS

| | | |
|---|---|---|
| JP | 59 45439 | 3/1984 |
| JP | 62 115440 | 5/1987 |
| JP | 05 113667 | 5/1993 |
| JP | 09 073173 | 3/1997 |
| JP | 09 090637 | 4/1997 |
| JP | 10 026828 | 1/1998 |
| JP | 10 161313 | 6/1998 |
| JP | 10 207069 | 8/1998 |
| JP | 11 109632 | 4/1999 |
| JP | 2000-026446 | 1/2000 |
| JP | 2000-321771 | 11/2000 |
| JP | 2000-338673 | 12/2000 |
| JP | 2001-242627 | 9/2001 |

* cited by examiner

*Primary Examiner*—Amanda C. Walke
(74) *Attorney, Agent, or Firm*—Melvin I. Stoltz

(57) ABSTRACT

A copolymer for semiconductor lithography, comprising at least a recurring unit (A) having a carboxylic acid ester structure whose solubility in alkali increases by the action of an acid and a carboxyl group-containing recurring unit (B), which copolymer is obtained via a step (P) of (co)polymerizing at least a monomer giving a recurring unit (A) and a step (Q) of forming a recurring unit (B) in the co-presence of a recurring unit (A)-containing (co)polymer and/or a monomer giving a recurring unit (A), and an acid.

The copolymer is used in production of semiconductor as a resist polymer which is small in roughness, little in development defect and superior in lithography properties such as DOF and the like.

18 Claims, No Drawings

COPOLYMER FOR SEMICONDUCTOR LITHOGRAPHY AND PROCESS FOR PRODUCTION THEREOF

BACKGROUND OF THE INVENTION

1. Field of the Invention

The present invention relates to a copolymer for the lithography used in production of semiconductor and a process for producing the copolymer. More particularly, the present invention relates to a copolymer for the semiconductor lithography suited for fine processing using a radiation such as far ultraviolet radiation, X-rays, electron beam or the like, as well as to a process for producing the copolymer.

2. Description of the Prior Art

In the lithography employed for semiconductor production, formation of a finer pattern is necessary with an increase in integration degree. In the formation of a fine pattern, a light source of short wavelength is essential. Currently, a lithography using a Krypton fluoride (KrF) excimer laser beam (wavelength: 248 nm) is the main lithography used in semiconductor mass production and, also, a lithography using an argon fluoride (ArF) excimer laser beam (wavelength; 193 nm) is being introduced in semiconductor mass production. Further, lithographies using a fluorine dimer ($F_2$) excimer laser beam (wavelength: 157 nm), extreme ultraviolet radiation (EUV), X-rays, electron beam or the like are being developed.

The resist polymers used in these lithographies are constituted so as to contain the following recurring units:

a recurring unit having a structure wherein a polar group soluble in alkaline developing solution (the group is hereinafter referred to as alkali-soluble group) has been protected with an acid-dissociating, non-polar substituent group for suppressing the solubility in alkaline developing solution (the substituent group is hereinafter referred to as acid-dissociating, dissolution-suppressing group), a recurring unit having a polar group for increasing the adhesivity to semiconductor substrate or the like, and, as necessary, a recurring unit having a polar or non-polar substituent group for controlling the solubility in resist solvent or alkaline developing solution. In the lithography using a KrF excimer laser beam as the light source, there are known copolymers containing a recurring unit derived from hydroxystyrene, and a recurring unit wherein a phenolic hydroxyl group derived from hydroxystyrene has been protected with an acid-dissociating, dissolution-suppressing group or a recurring unit wherein a carboxyl group derived from (meth)acrylic acid has been protected with an acid-dissociating, dissolution-suppressing group or the like (reference is made to, for example, Patent Literatures 1 to 4). There are also known copolymers containing a recurring unit using an alicyclic hydrocarbon group as an acid-dissociating, dissolution-suppressing group for increasing the dry etching resistance and the dissolution contrast between exposed area and non-exposed area (reference is made to, for example, Patent Literatures 5 to 6).

In the lithography using an ArF excimer laser beam of shorter wavelength or the like as the light source, there was investigated a copolymer containing no recurring unit derived from hydroxystyrene having a high absorptivity coefficient to a wavelength of 193 nm. As a result, there are known copolymers having, in the recurring unit, a lactone structure as a polar group for increasing the adhesivity to semiconductor substrate or the like (reference is made to, or example, Patent Literatures 7 to 10), and copolymers having, in the recurring unit, a polar group-containing, alicyclic hydrocarbon group (reference is made to, for example, Patent Literature 11). With these copolymers, however, there arose a problem of generation of pattern defect after development and there have been made various studies for improvement. As one such improvement, there are known copolymers having a lactone structure and an alicyclic hydrocarbon group as recurring units and further containing a recurring unit derived from (meth)acrylic acid (reference is made to, for example, Patent Literatures 12 to 13).

These techniques can suppress development defect; however, they were not sufficient in lithography properties such as DOF (depth of focus) and the like. Thus, there have been strongly needed a resist polymer small in development defect and superior in lithography properties and a process for producing such a resist polymer.

Patent Literature 1: JP-A-1984-045439
Patent Literature 2: JP-A-1993-113667
Patent Literature 3: JP-A-1998-026828
Patent Literature 4: JP-A-1987-115440
Patent Literature 5: JP-A-1997-073173
Patent Literature 6: JP-A-1998-161313
Patent Literature 7: JP-A-1997-090637
Patent Literature 8: JP-A-1998-207069
Patent Literature 9: JP-A-2000-026446
Patent Literature 10: JP-A-2001-242627
Patent Literature 11: JP-A-1999-109632
Patent Literature 12: JP-A-2000-321771
Patent Literature 13: JP-A-2000-338673

SUMMARY OF THE INVENTION

The present invention has been made in view of the above-mentioned background art, and aims at providing a resist polymer used in semiconductor production, which is small in roughness, little in development defect and superior in lithography properties such as DOF and the like, and a process for producing such a resist polymer.

The present inventors made a study in order to achieve the above aim. As a result, it was found that the aim can be achieved by a copolymer comprising at least, a recurring unit (A) having a carboxylic acid ester structure whose solubility in alkali increases by the action of an acid and a carboxyl group-containing recurring unit (B), which copolymer is obtained via a step (P) of (co)polymerizing at least, a monomer giving a recurring unit (A) and a step (Q) of forming a recurring unit (B) in the co-presence of a recurring unit (A)-containing (co)polymer and/or a monomer giving a recurring unit (A), and an acid. The finding has led to the completion of the present invention.

By using the copolymer of the present invention, there can be obtained a fine and good lithography pattern which is suppressed in development defect, is large in DOF, and accordingly is suitably used in semiconductor production.

DETAILED DESCRIPTION OF THE INVENTION

The present invention provides a copolymer for semiconductor lithography, comprising at least a recurring unit (A) having a carboxylic acid ester structure whose solubility in alkali increases by the action of an acid and a carboxyl group-containing recurring unit (B), which copolymer is obtained via a step (P) of (co)polymerizing at least a monomer giving a recurring unit (A) and a step (Q) of forming a recurring unit (B) in the co-presence of a recurring unit (A)-containing (co)polymer and/or a monomer giving a recurring unit (A), and an acid; and a process for producing the copolymer.

The copolymer of the present invention preferably comprises a recurring unit (C) having a lactone structure, and more preferably comprises a recurring unit (D) having an acid stable carboxylic acid ester structure substituted with an acid-stable, alicyclic hydrocarbon group.

As a preferable example of the recurring unit (A), a structure represented by the following general formula (a) can be mentioned:

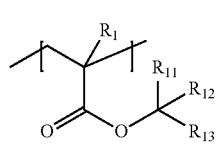

[general formula (a)]

(wherein $R_1$ is a hydrogen atom or a hydrocarbon group having 1 to 4 carbon atoms; $R_{11}$ is a hydrocarbon group having 1 to 4 carbon atoms; $R_{12}$ and $R_{13}$ are each independently a straight chain or branched chain hydrocarbon group having 1 to 12 carbon atoms, or an alicyclic hydrocarbon group of single ring or bridge-containing ring, or, $R_{12}$ and $R_{13}$ bond to each other to form an alicyclic hydrocarbon group of single ring or bridge-containing ring, having 5 to 12 carbon atoms; or, $R_{11}$ and $R_{12}$ are each a hydrogen atom or a hydrocarbon group having 1 to 4 carbon atoms, and $R_{13}$ is an oxy group substituted with a straight chain or branched chain hydrocarbon group having 1 to 12 carbon atoms or with an alicyclic hydrocarbon group of single ring or bridge-containing ring).

The monomer giving the recurring unit (A) can be represented by the following general formula (am):

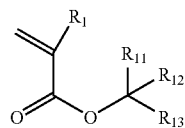

[general formula (am)]

(wherein $R_1$ is a hydrogen atom or a methyl group; $R_{11}$ is an alkyl group having 1 to 4 carbon atoms; $R_{12}$ and $R_{13}$ are each independently a straight chain or branched chain hydrocarbon group having 1 to 12 carbon atoms, or an alicyclic hydrocarbon group of single ring or bridge-containing ring, or, $R_{12}$ and $R_{13}$ bond to each other to form an alicyclic hydrocarbon group of single ring or bridge-containing ring, having 5 to 12 carbon atoms; or, $R_{11}$ and $R_{12}$ are each a hydrogen atom or an alkyl group having 1 to 4 carbon atoms, and $R_{13}$ is an ether bond substituted with a straight chain or branched chain hydrocarbon group having 1 to 12 carbon atoms or with an alicyclic hydrocarbon group of single ring or bridge-containing ring).

As specific examples of the general formula (am), the following (meth)acrylates can be mentioned. They can be used singly or in combination of two or more kinds.

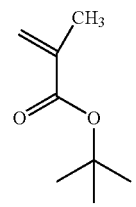

(a101)

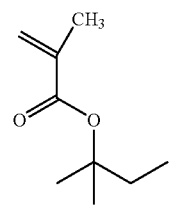

(a102)

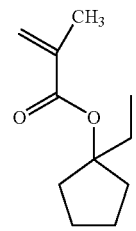

(a103)

(a104)

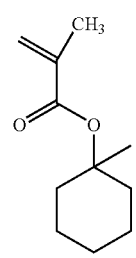

(a105)

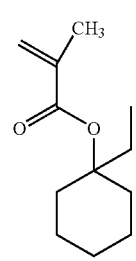

(a106)

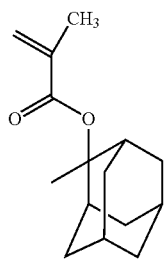 (a107)
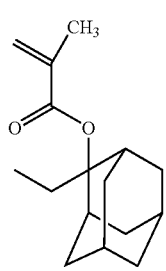 (a108)
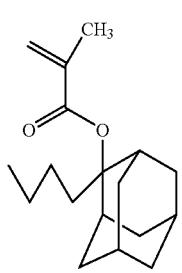 (a109)
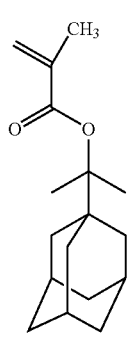 (a110)
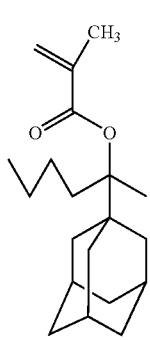 (a111)
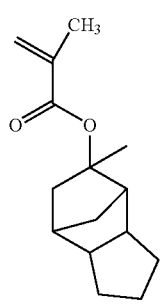 (a112)
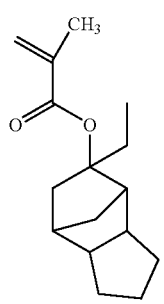 (a113)
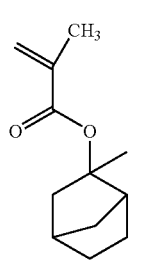 (a114)
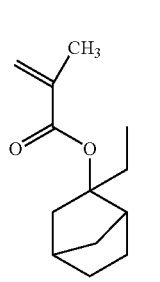 (a115)
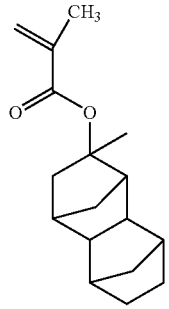 (a116)

(a117) 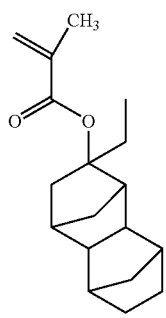
(a151) 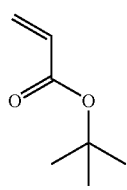
(a152) 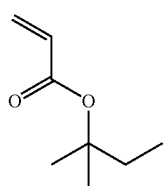
(a153) 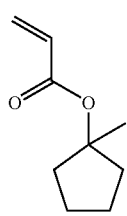
(a154) 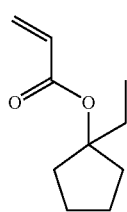
(a155) 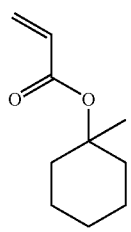
(a156) 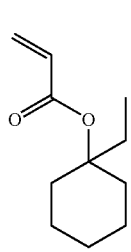
(a157) 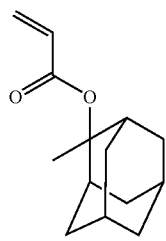
(a158) 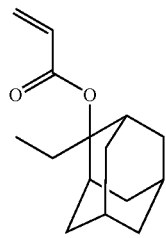
(a159) 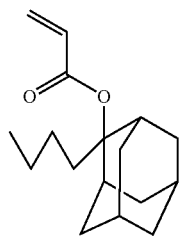
(a160) 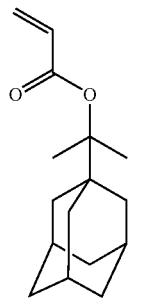
(a161) 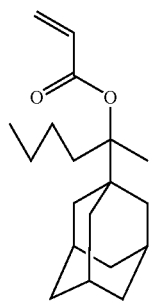
(a162) 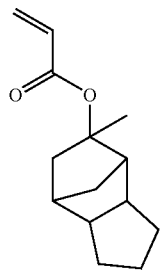

-continued
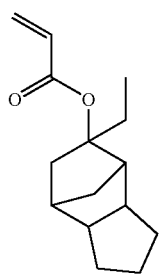 (a163)
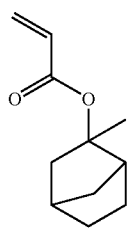 (a164)
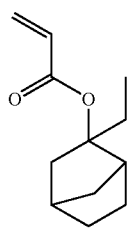 (a165)
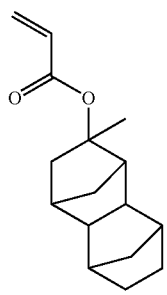 (a166)
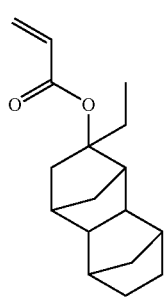 (a167)
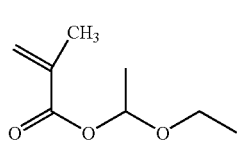 (a201)
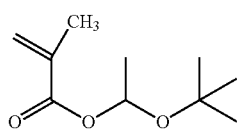 (a202)
-continued
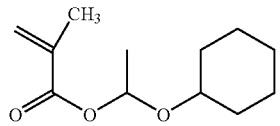 (a203)
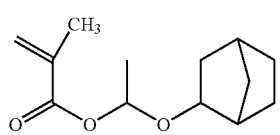 (a204)
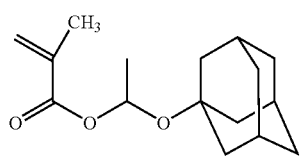 (a205)
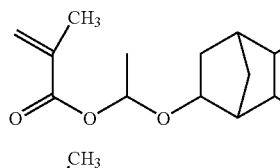 (a206)
(a211)
(a212)
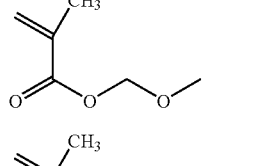 (a213)
(a214)
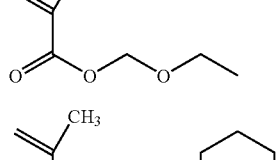 (a215)
(a216)
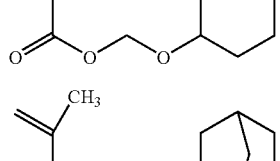 (a251)
(a252)

-continued

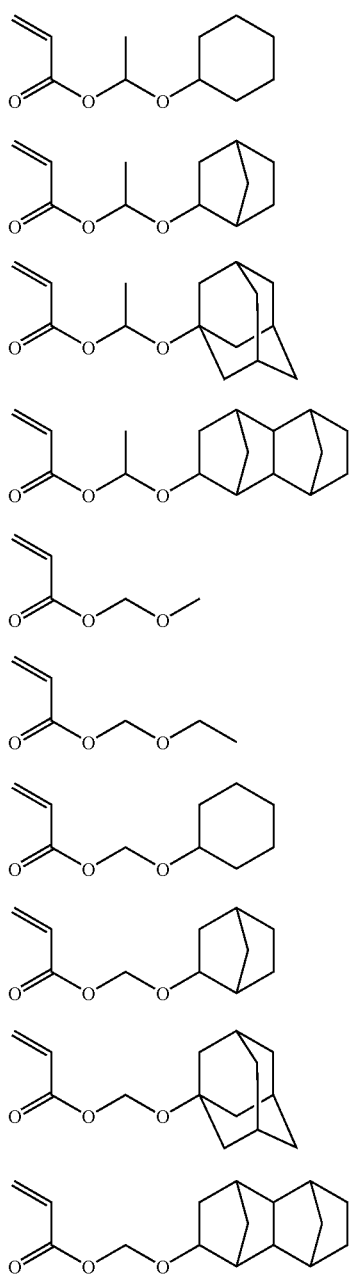

(a253)
(a254)
(a255)
(a256)
(a261)
(a262)
(a263)
(a264)
(a265)
(a266)

As a preferable example of the recurring unit (B), a structure represented by the following general formula (b) can be mentioned:

[general formula (b)]

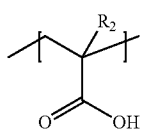

(wherein $R_2$ is a hydrogen atom or a hydrocarbon group having 1 to 4 carbon atoms).

It is essential that the recurring unit (B) is formed by the step (Q) from at least a recurring unit (A) or a monomer giving a recurring unit (A); however, when the recurring unit (B) is formed by the step (Q) also from a recurring unit (C) (described later) or a monomer giving a recurring unit (C), the portion formed by the recurring unit (C) or the monomer can be included in the recurring unit (B).

As specific examples of the recurring unit (B) formed by the step (Q), at least the following two recurring units can be mentioned:

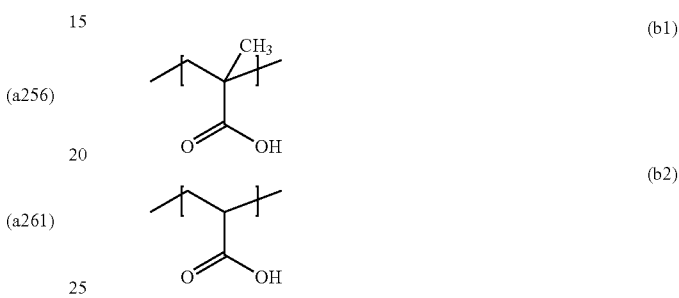

(b1)

(b2)

When the lactone ring of the recurring unit (C) is opened, the opened structure can also be included in the recurring unit (B).

More preferably, the copolymer of the present invention contains a recurring unit (C) having a lactone structure represented by the following general formula (c), in order to have higher adhesivity to semiconductor substrate or lower film and higher solubility in resist solvent:

[general formula (c)]

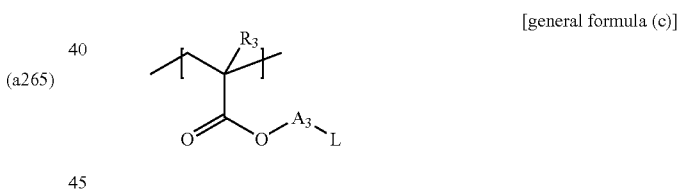

(wherein $R_3$ is a hydrogen atom or a hydrocarbon group having 1 to 4 carbon atoms; $A_3$ is a single bond, or an alicyclic hydrocarbon group of single ring or bridge-containing ring, having 5 to 12 carbon atoms; L is a lactone structure represented by the following general formula (L); $A_3$ and L bond to each other via one or two connecting bonds:

[general formula (L)]

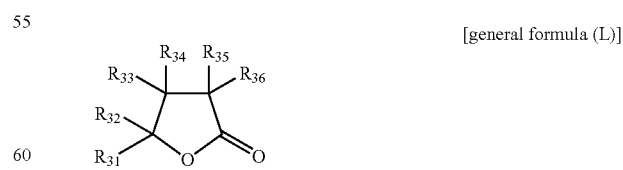

(wherein any one or two of $R_{31}$ to $R_{36}$ are connecting bonds to $A_3$ of the general formula (c) and the remainder is each a hydrogen atom or a hydrocarbon or alkoxyl group having 1 to 4 carbon atoms).

The recurring unit (C) can be formed in the step (P) by copolymerizing a monomer represented by the following general formula (cm):

[general formula (cm)]

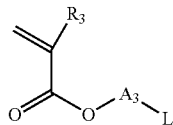

(wherein $R_3$ is a hydrogen atom or a hydrocarbon group having 1 to 4 carbon atoms; $A_3$ is a single bond, or an alicyclic hydrocarbon group of single ring or bridge-containing ring, having 5 to 12 carbon atoms; L is a lactone structure represented by the general formula (L); $A_3$ and L bond to each other via one or two connecting bonds).

As examples of the monomer represented by the general formula (cm), the (meth)acrylates shown below can be mentioned. They can be used singly or in combination of two or more kinds.

(c101)

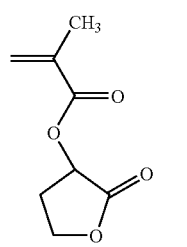

(c102)

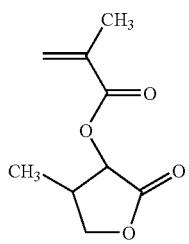

(c103)

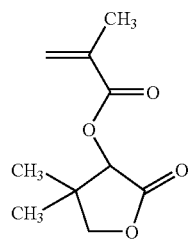

(c104)

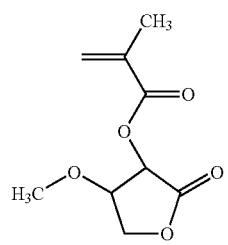

(c105)

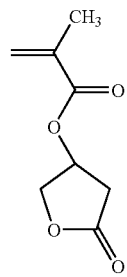

(c151)

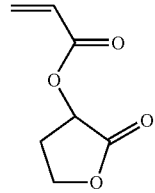

(c152)

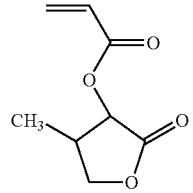

(c153)

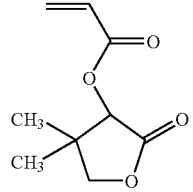

(c154)

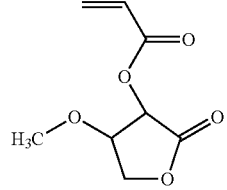

(c155)

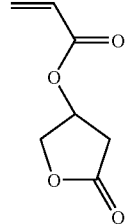

(c201)

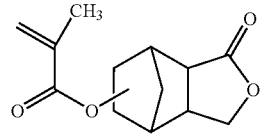

(c202)

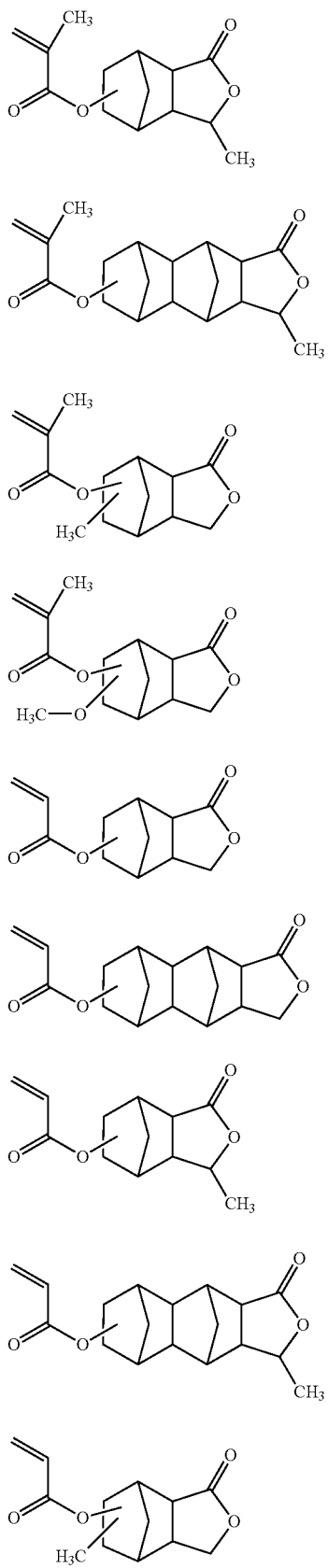
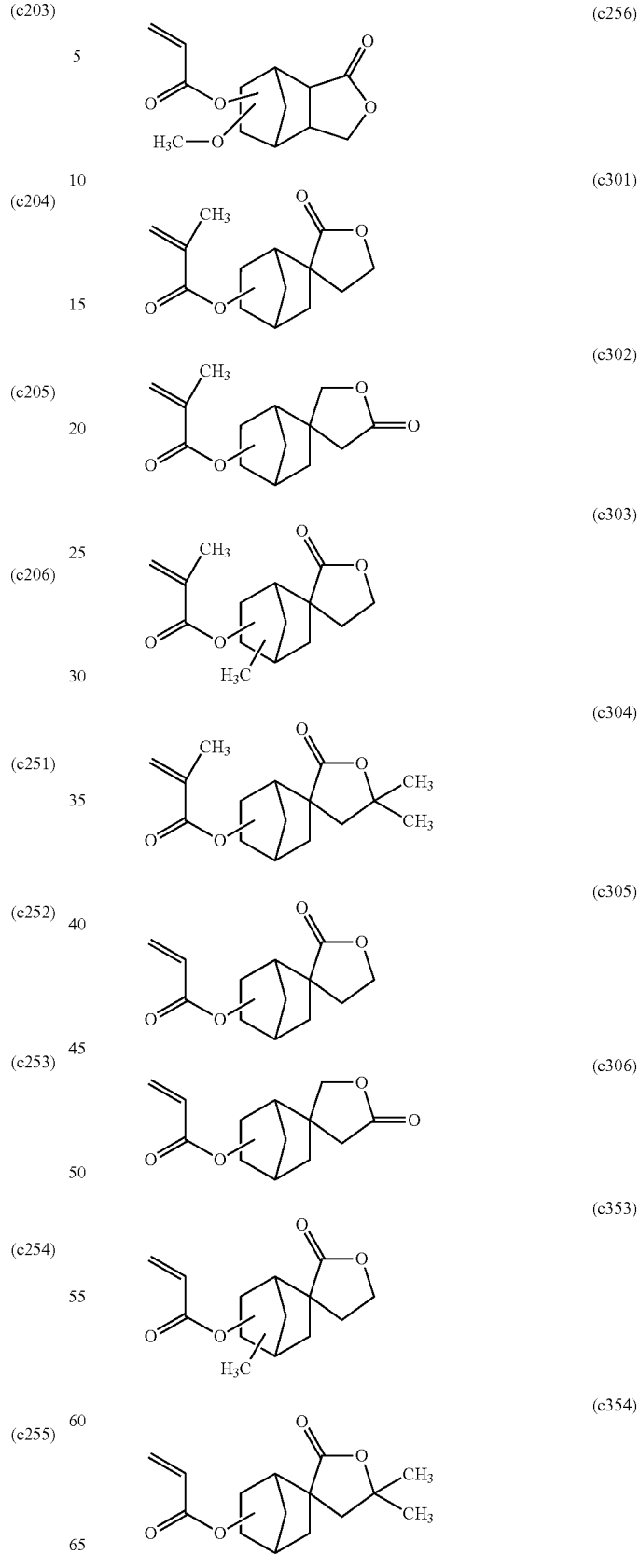

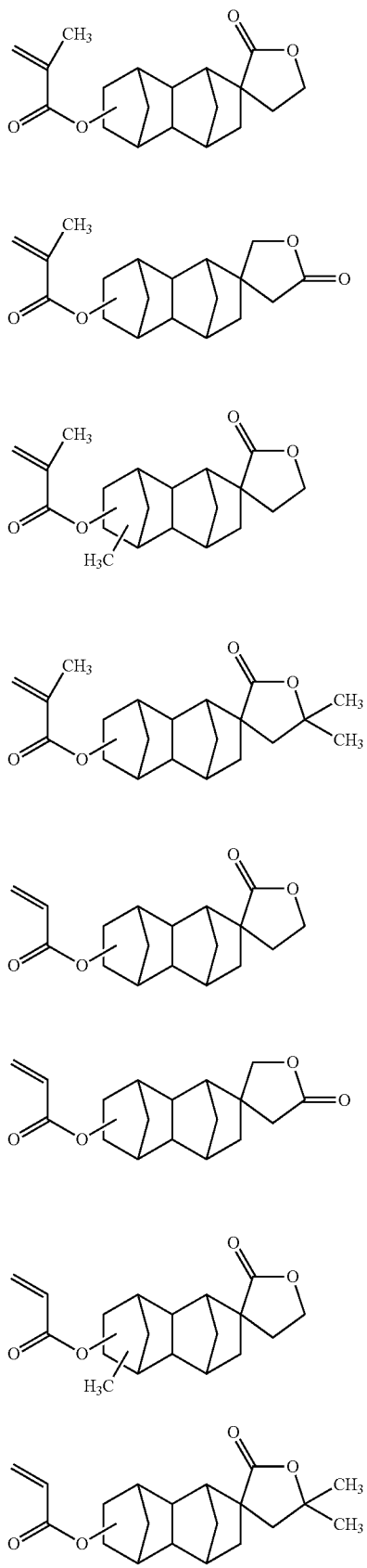

-continued (c451)
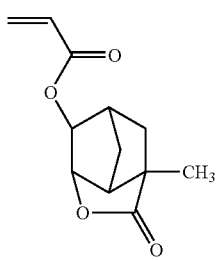

(c452)
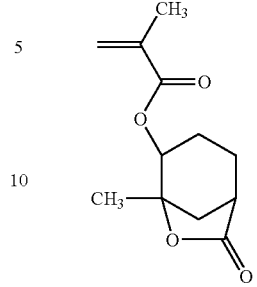

(c503)

(c453)
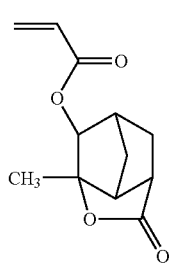

(c551)
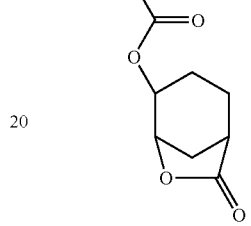

(c552)

(c454)
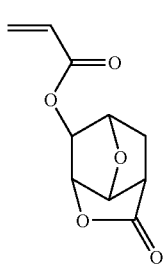

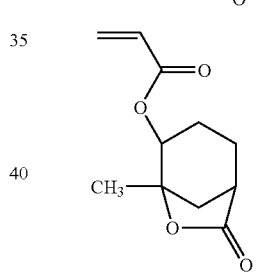

(c553)

(c501)
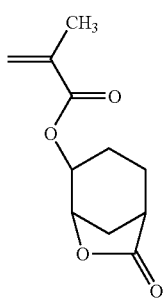

Preferably, the copolymer of the present invention contains a recurring unit (D) having a carboxylic acid ester structure substituted with an acid-stable, alicyclic hydrocarbon group represented by the following general formula (d), in order to have controlled solubility in resist solvent or alkaline developing solution or have higher plasma etching resistance:

[general formula (d)]

(c502)
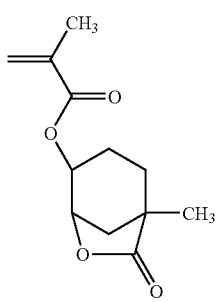

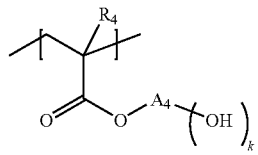

(wherein $R_4$ is a hydrogen atom or a hydrocarbon group having 1 to 4 carbon atoms; $A_4$ is an alicyclic hydrocarbon group having a bridge-containing ring of 7 to 12 carbon atoms, which may be substituted with halogen atom; and k is an integer of 0 to 3).

The recurring unit (D) can be formed in the step (P) by copolymerizing a monomer represented by the following general formula (dm):

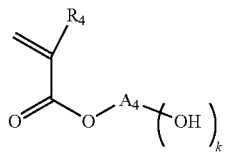

[general formula (dm)]

(wherein $R_4$ is a hydrogen atom or a hydrocarbon group having 1 to 4 carbon atoms; $A_4$ is an alicyclic hydrocarbon group having a bridge-containing ring of 7 to 12 carbon atoms, which may be substituted with halogen atom; and k is an integer of 0 to 3).

As specific examples of the general formula (dm), the (meth)acrylates shown below can be mentioned. They can be used singly or in combination of two or more kinds.

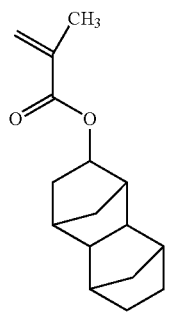 (d101)

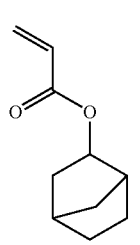 (d102)

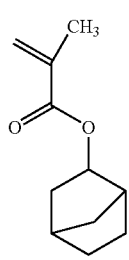 (d103)

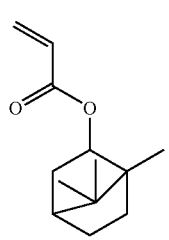 (d104)

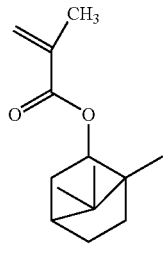 (d105)

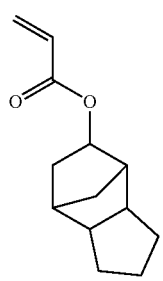 (d151)

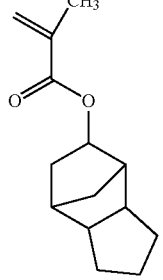 (d152)

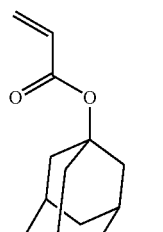 (d153)

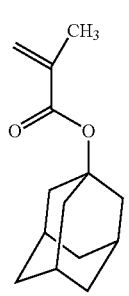 (d154)

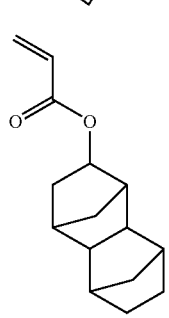 (d155)

-continued
(d201)
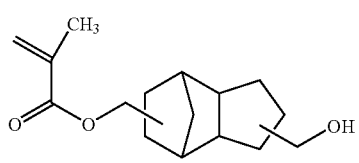
(d251)
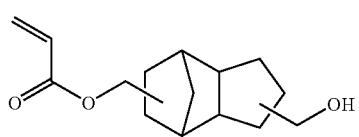
(d301)
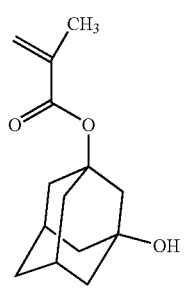
(d302)
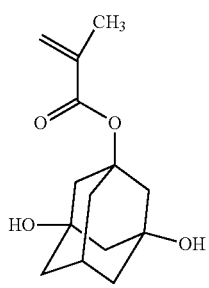
(d303)
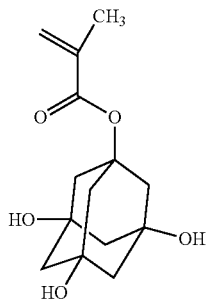
(d351)
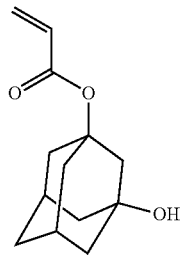
-continued
(d352)
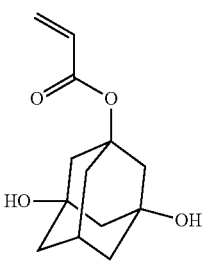
(d353)
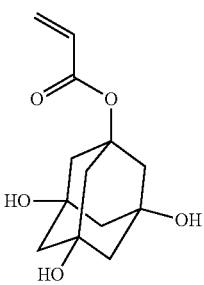
(d401)
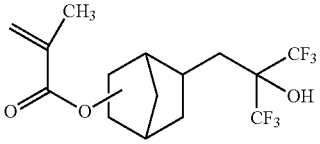
(d402)
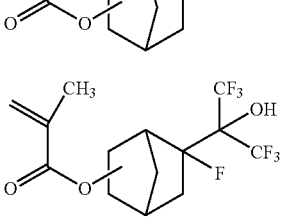
(d403)
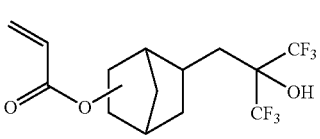
(d451)
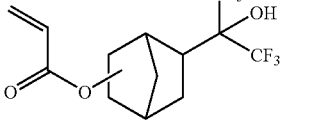
(d452)
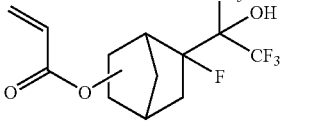
(d453)
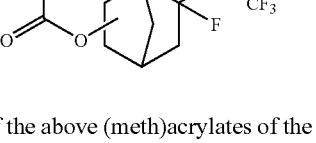
Of the above (meth)acrylates of the general formula (dm), hydroxyadamantyl (meth)acrylates of (d301) to (d303) and (d351) to (d353) are preferred because a good resist pattern shape is obtained easily therewith or the resist film formed therewith has high plasma etching resistance; and (d301) and (d351) are preferred particularly.

It is possible to further copolymerize a monomer represented by the following general formula (em), in order to control the solubility of the copolymer formed or the diffusion rate of acid in resist film:

[general formula (em)]

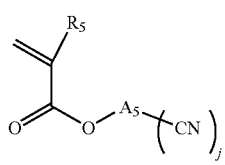

(wherein $R_5$ is a hydrogen atom or a hydrocarbon group having 1 to 4 carbon atoms; $A_5$ is a mono- to tri-valent alicyclic hydrocarbon group having a bridge-containing ring of 7 to 12 carbon atoms, which may be substituted with halogen atom; and j is an integer of 1 to 2).

As specific examples of the general formula (em), the (meth)acrylates shown below can be mentioned. They can be used singly or in combination of two or more kinds.

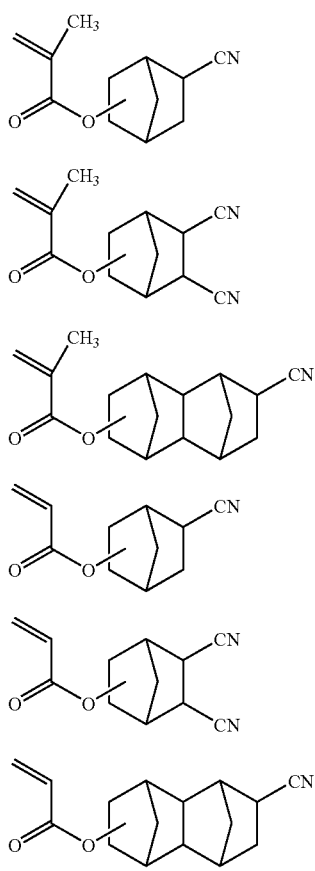

(e101)

(e102)

(e103)

(e151)

(e152)

(e153)

The recurring unit (B) is very important in the present invention. With a higher proportion of the recurring unit (B), defect is less. When the recurring unit (B) is formed only by copolymerization of a monomer giving the general formula (b), DOF is small; however, when the recurring unit (B) is formed via the step (Q), DOF is large. Accordingly, in the present invention, a larger proportion of the recurring unit (B) is preferred. However, with too large a proportion of the recurring unit (B), there arises problems such as easy swelling of pattern during development and the like; therefore, the proportion of the recurring unit (B) can be selected ordinarily in a range of 1 to 20 mol %, preferably in a range of 2 to 10 mol %, particularly preferably in a range of 3 to 8 mol %. The proportions of other recurring units (A), (C) and (D) can be selected in ranges wherein the basic properties in semiconductor lithography are not impaired. That is, the proportion of the recurring unit (A) can be selected in a range of 10 to 60 mol %, the proportion of the recurring unit (C) can be selected in a range of 10 to 70 mol %, and the proportion of the recurring unit (D) can be selected in a range of 0 to 40%. Particularly preferably, the recurring unit (A) is 20 to 50 mol %, the recurring unit (C) is 20 to 60 mol %, and the recurring unit (D) is 5 to 35 mol %.

As to the weight-average molecular weight (Mw) of the copolymer, when it is too high, the solubility of copolymer in resist solvent or alkaline developing solution is low. Meanwhile, when it is too low, the properties of resist film are inferior. Therefore, the weight-average molecular weight (Mw) of the copolymer is preferably in a range of 2,000 to 40,000, more preferably in a range of 3,000 to 30,000, particularly preferably in a range of 4,000 to 25,000. The molecular weight distribution (Mw/Mn) of the copolymer is preferably in a range of 1.0 to 5.0, more preferably in a range of 1.0 to 3.0, particularly preferably in a range of 1.2 to 2.5.

The step (P) can be conducted by radical polymerization in an organic solvent. The method thereof can be selected from publicly known methods with no restriction. Such methods include, for example, (1) a simultaneous polymerization method wherein a monomer(s) and a polymerization initiator are dissolved in a solvent and the solution is heated to give rise to polymerization, (2) a dropping polymerization method wherein a monomer(s) and a polymerization initiator are dissolved in the same solvent as necessary and then dropped together into a heated solvent to give rise to polymerization, (3) an independent dropping polymerization method wherein a monomer(s) and a polymerization initiator are independently dissolved in a solvent as necessary and then dropped independently into a heated solvent to give rise to polymerization, and (4) an initiator-dropping polymerization method wherein a monomer (s) is (are) dissolved in a solvent and heated and a polymerization initiator separately dissolved in a solvent is dropped into the heated monomer(s) solution to give rise to polymerization. Here, in the polymerization system in the cases of the methods (1) and (4) and in the to-be-dropped solution tank in the case of the method (2), an unreacted monomer(s) of high concentration contacts (contact) with a radical of low concentration; therefore, there is easy formation of a high polymer having a molecular weight of 100,000 or more which is one cause of defect generation. In contrast, with the independent addition polymerization method (3), there is no formation of a high polymer because the monomer(s) does (do) not co-exist with the polymerization initiator in the to-be-dropped solution tank and, even when the monomer(s) is (are) dropped into the polymerization system, the unreacted monomer(s) is (are) at a low concentration(s) and accordingly there is no formation of a high polymer. Thus, the independent dropping polymerization method (3) is particularly preferred as the polymerization method of the present invention.

In the present invention, a chain transfer agent may be used. In the simultaneous polymerization method (1), the chain transfer agent can be dissolved in a solvent together with the monomer(s) and the polymerization initiator and then heated. In the dropping polymerization methods (2) to (4), the chain transfer agent may be mixed with the monomer(s) and then dropped, or may be mixed with the polymerization initiator and then dropped, or may be dissolved in a heated solvent.

In the dropping polymerization methods (2) and (3), there may be changed, with the lapse of the dropping time, the composition of monomers dropped, the proportions of monomers, polymerization initiator and chain transfer agent dropped, etc.

As to the polymerization initiator, there is no particular restriction as long as it is one generally used as a radical-generating agent. There can be used, for example, azo compounds such as 2,2'-azobisisobutyronitrile, 2,2'-azobis(2-methylbutyronitrile), dimethyl 2,2'-azobisisobutyrate, 1,1'-azobis(cyclohexane-1-carbonitrile), 4,4'-azobis(4-cyanovaleric acid) and the like; and organic peroxides such as decanoyl peroxide, lauroyl peroxide, benzoyl peroxide, bis (3,5,5-trimethylhexanoyl) peroxide, succinic acid peroxide, tert-butyl peroxy-2-ethylhexanoate, tert-butyl peroxypivalate, 1,1,3,3-tetramethylbutyl peroxy-2-ethylhexanoate and the like. These compounds can be used singly or in admixture. The amount of the polymerization initiator used can be determined depending upon various conditions such as intended Mw, the kinds of monomer(s), polymerization initiator, chain transfer agent and solvent, the composition of copolymer, polymerization temperature, dropping rate and the like.

As the chain transfer agent, there can be used, for example, publicly known thiol compounds such as dodecanethiol, mercaptoethanol, mercaptopropanol, mercaptoacetic acid, mercaptopropionic acid and the like. These compounds can be used singly or in admixture. As a particularly preferred chain transfer agent, a mercaptoalkylhexafluoropropanol compound such as represented by the following general formula (fm) can be mentioned. By using such a chain transfer agent, a substituent group containing a hydroxyhexafluoropropylidene structure can be introduced into the terminal of the copolymer. This substituent group has an appropriate acid dissociation constant and thereby is effective for reduction in defect or in LER (line edge roughness, i.e. non-uniform roughness of line side wall).

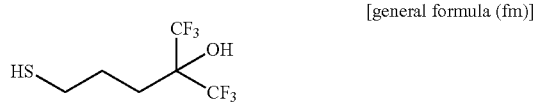

[general formula (fm)]

The amount of the chain transfer agent used can be determined depending upon various conditions such as intended Mw, the kinds of monomer(s), polymerization initiator, chain transfer agent and solvent, the composition of copolymer, polymerization temperature, dropping rate and the like.

As to the solvent, there is no particular restriction as long as it is a compound publicly known as a solvent and can dissolve the monomer(s), polymerization initiator and chain transfer agent used and further the copolymer obtained by polymerization. As examples of such a solvent, there can be mentioned ketones such as acetone, methyl ethyl ketone, methyl iso-amyl ketone, methyl amyl ketone, cyclohexanone and the like; esters such as methyl acetate, ethyl acetate, butyl acetate, methyl propionate, methyl 3-methoxypropionate, ethyl 3-ethoxypropionate, methyl lactate, ethyl lactate, γ-butyrolactone and the like; ethers such as tetrahydrofuran, dioxane, ethylene glycol dimethyl ether, diethylene glycol dimethyl ether and the like; ether alcohols such as ethylene glycol monomethyl ether, ethylene glycol monoethyl ether, ethylene glycol monobutyl ether, propylene glycol monomethyl ether, 3-methoxy-3-methyl-1-butanol and the like; ether esters which are ester compounds between the above-mentioned ether alcohol and acetic acid or the like; aromatic hydrocarbons such as toluene, xylene and the like; amides such as N,N-dimethylformamide, N-methylpyrrolidone and the like; dimethyl sulfoxide; and acetonitrile. They can be used singly or in admixture of two or more kinds.

The polymerization temperature can be appropriately determined depending upon, for example, the boiling points of solvent, monomer(s), chain transfer agent, etc, and the half-life temperature of polymerization initiator. With a low polymerization temperature, polymerization is unlikely to proceed, posing a problem in productivity; with an unnecessarily high polymerization temperature, there is a problem in the stabilities of monomer(s) and resist polymer. Accordingly, the polymerization temperature is selected in a range of preferably 40 to 120° C., particularly preferably 60 to 100° C.

As to the dropping time in the dropping polymerization methods (2) and (3), a short time is not preferred because the molecular weight distribution of the polymer obtained tends to be wide and the dropping of a large amount of solution at one time gives rise to temperature fall of polymerization mixture; and a long time is not preferred because the copolymer formed undergoes a more-than-required thermal history, which lowers productivity. Accordingly, the dropping time is selected in a range of ordinarily 30 minutes to 24 hours, preferably 1 to 12 hours, particularly preferably 2 to 8 hours. After the dropping in the dropping polymerization methods or after the arrival at the polymerization temperature in the simultaneous polymerization method, it is preferred that the system temperature is kept at a given temperature or is increased to conduct aging to react remaining unreacted monomer(s). As to the time of aging, too long a time is not preferred because the production efficiency per hour is low and the copolymer formed undergoes a more-than-required thermal history. Accordingly, the aging time is selected in a range of ordinarily 12 hours or less, preferably 6 hours or less, particularly preferably 1 to 4 hours.

The step (Q) may be conducted simultaneously with the step (P) or may be conducted after the step (P). When the step (P) and the step (Q) are conducted simultaneously, the polymerization in the presence of an acid enables parallel proceeding of polymerization and deprotection. The acid may co-exist, before polymerization, with the solvent, the monomer(s), the polymerization initiator or the chain transfer agent, or, may be fed, during polymerization, singly or together with the solvent, the monomer(s), the polymerization initiator or the chain transfer agent. The timing of acid feeding may be any of before heating, during dropping, during aging and after aging. The step (Q), when conducted after the step (P), can be conducted successively from the step (P) or after the impurities [e.g. unreacted monomer(s)] remaining after the step (P) have been removed by purification, with heating in the presence of an acid.

There is no particular restriction as to the kind of the acid used, as long as the acid can dissociate the acid-dissociating, dissolution-suppressing group of the recurring unit (A) and/ or the monomer giving the recurring unit (A). However, the acid is preferred to be a strong acid having a pKa of preferably 2.0 or less, more preferably 1.0 or less, particularly preferably 0.5 or less, in water at 25° C. As specific examples of such a strong acid, there can be mentioned perfluorocarboxylic acids such as trifluoroacetic acid and the like; organic sulfonic acids such as trifluoro-methanesulfonic acid, methanesulfonic acid, p-toluenesulfonic acid and hydrate thereof, benzenesulfonic acid and hydrate thereof, and the like; and inorganic acids such as sulfuric acid, hydrochloric acid, nitric acid, perchloric acid, hydrobromic acid and the like. These strong acids may be used in admixture of two or more kinds.

The concentration of acid, the reaction temperature and the reaction time can be determined appropriately depending upon the intended dissociation degree of the acid-dissociating, dissolution-suppressing group and the kinds of the acid and the acid-dissociating, dissolution-suppressing group. The acid is allowed to be present in the reaction mixture at a concentration of ordinarily 0.1 to 1,000 ppm, preferably 1 to 500 ppm, particularly preferably 2 to 200 ppm. The reaction temperature is ordinarily 40° C. or more, preferably the polymerization temperature; and the reaction time is 30 minutes or more, preferably 1 hour or more.

The copolymer obtained via the step (P) or via the step (P) and the step (Q) contains unrequited substances such as unreacted monomer(s), low-molecular components (e.g. oligomer), polymerization initiator and chain transfer agent and reaction residues thereof, acid used in the step (Q), and the like; therefore, the copolymer is preferably purified by a step (R). As the purification method, there can be mentioned, for example, a method (R-1) wherein a poor solvent is added to precipitate a copolymer and then the solvent phase is separated; a method (R-1a) wherein, following the method (R-1), a poor solvent is added to wash the copolymer and then the solvent phase is separated; a method (R-1b) wherein, following the method (R-1), a good solvent is added to redissolve the copolymer, a poor solvent is added to reprecipitate a copolymer and then the solvent phase is separated; a method (R-2) wherein a poor solvent is added to form two phases, i.e. a poor solvent phase and a good solvent phase and then the poor solvent phase is separated; and a method (R-2a) wherein, following the method (R-2), a poor solvent is added to wash the good solvent phase and then the poor solvent phase is separated. The methods (R-1a), (R-1b) and (R-2a) may each be repeated, or may be combined. After the step (Q), there may be conducted a method (R-3) wherein neutralization is conducted using a basic substance such as amine or the like, or a method (R-4) wherein the acid component is removed by, for example, adsorption by basic ion exchange resin or the like. The method (R-3) or (R-4) may be combined with the method (R-1), (R-1a), (R-1b), (R-2) or (R-2a).

The poor solvent is not particularly restricted as long as the copolymer is sparingly soluble therein; and there can be used, for example, water, alcohols (e.g. methanol and isopropanol), and saturated hydrocarbons (e.g. hexane and heptane). When the acid used in the step (Q) is removed by the method (R-1) or the method (R-2), it is preferred to use water or an alcohol (e.g. methanol or isopropanol). The good solvent is not particularly restricted as long as the copolymer dissolves easily therein, and can be used as a single solvent or a mixed solvent. The good solvent is preferably the same solvent as the polymerization solvent, for control of the process for copolymer production. As examples of the good solvent, there can be mentioned the same solvents as specifically mentioned as the reaction solvent of the step (P) or the step (Q).

The copolymer after purification contains the solvent used in the purification and, therefore, is subjected to drying under reduced pressure and thereby is finished into a dried, solid copolymer of reduced solvent content. Or, the copolymer before or after drying is dissolved in a solvent specifically mentioned as the reaction solvent of the step (P) or the step (Q), or in an organic solvent which constitutes a resist composition described later (the organic solvent is hereinafter referred to as resist solvent), and then the resulting solution is subjected to distillation while the resist solvent is fed as necessary, to remove low-boiling compounds other than the resist solvent, to obtain a solution of a copolymer dissolved in the resist solvent.

The temperature of the reduced-pressure drying or the solvent substitution is not particularly restricted unless the copolymer undergoes property change, and is ordinarily 100° C. or less, preferably 80° C. or less, particularly preferably 70° C. or less. As to the amount of the resist solvent used for the solvent substitution, too small an amount is not preferred because the removal of low-boiling compounds is not sufficient, and too large an amount is not preferred because a long time is taken for the solvent substitution and the copolymer formed undergoes a more-than-required thermal history. The amount of the resist solvent used is ordinarily 1.05 to 10 times, preferably 1.1 to 5 times, particularly preferably 1.2 to 3 times the solvent amount in the copolymer solution obtained.

The dried, solid copolymer is dissolved in one kind of resist solvent or in two or more kinds of resist solvents. The solution of the copolymer dissolved in the resist solvent is diluted as necessary with the resist solvent or mixed with other kind of resist solvent. To the resulting copolymer solution are added a radiation-sensitive, acid-generating agent (X) [hereinafter referred to as component (X)], an acid diffusion-suppressing agent [hereinafter referred to as component (Y)] (e.g. a nitrogen-containing organic compound) for prevention of acid diffusion into the area not exposed to radiation and, as necessary, other additive (Z) [hereinafter referred to as component (Z)], whereby a resist composition is obtained finally.

The component (X) can be appropriately selected from those compounds heretofore proposed as the radiation-sensitive, acid-generating agent for chemical amplification type resist. As examples thereof, there can be mentioned onium salts such as iodonium salt, sulfonium salt and the like; oxime sulfonates; diazomethanes such as bisalkyl- or bisarylsulfonyldiazomethane and the like; nitrobenzylsulfonates; iminosulfonates; and disulfones. Of these, an onium salt using a fluorinated alkylsulfonic acid ion as the anion is particularly preferred. They can be used singly or in combination of two or more kinds. The component (X) is used in an amount of ordinarily 0.5 to 30 parts by mass, preferably 1 to 10 arts by mass relative to 100 parts by mass of the copolymer.

The component (Y) can be appropriately selected from those compounds heretofore proposed as the acid diffusion-suppressing agent for chemical amplification type resist. As examples thereof, there can be mentioned nitrogen-containing organic compounds, and primary to tertiary alkylamines and hydroxyalkylamines are preferred. Tertiary alkylamines and tertiary hydroxyalkylamines are preferred particularly. Of them, triethanolamine and triisopropanolamine are most preferred. They can be used singly or in combination of two or more kinds. The component (Y) is used in an amount of ordinarily 0.01 to 5.0 parts by mass relative to 100 parts by mass of the copolymer.

The resist solvent may be any solvent as long as it can dissolve each component constituting the resist composition and form a homogeneous solution. It can be selected freely from the solvents each heretofore known publicly as a solvent for chemical amplification type resist, and can be used as a single solvent or a mixed solvent of two or more kinds. Ordinarily, it can be selected from the solvents specifically mentioned as the reaction solvent of the step (P) or the step (Q) or as the good solvent of the step (R), in view of the solvency for the composition excluding the copolymer, the viscosity, the boiling point, the absorption of the radiation used in lithography, etc. Preferred resist solvents are methyl amyl ketone, cyclohexanone, ethyl lactate (EL), γ-butyrolactone and propylene glycol monomethyl ether acetate (PGMEA). A mixed solvent of PGMEA and other polar solvent is preferred particularly. As the polar solvent used in the mixed solvent, EL is preferred particularly.

The amount of the resist solvent contained in the resist composition is not particularly restricted. Ordinarily, it is appropriately determined so that the resulting composition has a concentration allowing for coating on substrate or the like and has a viscosity appropriate for the intended thickness of coating film. In general, the resist solvent is used so that the solid content in the resist composition becomes 2 to 20% by mass, preferably 5 to 15% by mass.

As the additive (Z), there can be appropriately and as necessary added compounds conventionally used as additives for resist, such as organic carboxylic acid and phosphorus-containing oxo-acid for prevention of sensitivity deterioration of acid-generating agent or for improvement of shape and stability of resist pattern, additional resin for improvement of resist film properties, surfactant for improvement of coatability, dissolution-suppressing agent, plasticizer, stabilizer, coloring agent, halation-preventing agent, dye and the like. As examples of the organic carboxylic acid, there can be mentioned malonic acid, citric acid, malic acid, succinic acid, benzoic acid, salicylic acid, etc., and they can be used singly or in admixture of two or more kinds. The organic carboxylic acid is used in an amount of 0.01 to 5.0 parts by mass relative to 100 parts by mass of the copolymer.

By using the copolymer for semiconductor lithography according to the present invention, there can be obtained a resist composition which is reduced in defect in resist pattern formation and superior in lithography properties such as DOF and the like. The reason therefor is not certain but can be presumed to be as follows. As one means for defect reduction, it is considered to introduce a hydrophilic group such as hydroxyl group, carboxyl group or the like into the recurring units of the copolymer to allow the copolymer to have an increased affinity toward the developing solution used. Carboxyl group, in particular, has high hydrophilicity and is considered to be highly effective. As a means for introduction of carboxyl group, copolymerization of (meth)acrylic acid is mentioned. However, the relative reactivity of (meth)acrylic acid in radical polymerization is extremely high as compared with the relative reactivity of other monomer having a lactone structure or an alicyclic hydrocarbon group; therefore, the resulting copolymer becomes non-uniform in the distribution of individual recurring units, that is, becomes a mixture of polymer molecular chains rich in (meth)acrylic acid and high in hydrophilicity and polymer molecular chains poor in (meth)acrylic acid and high in hydrophobicity. This is presumed to deteriorate lithography properties represented by DOF.

In contrast, the copolymer of the present invention is obtained by conducting copolymerization while forming (meth)acrylic acid in the polymerization system, or by dissociating the acid-dissociating group of the acid-dissociating recurring unit of the copolymer to form a recurring unit derived from (meth)acrylic acid; therefore, it is considered that in the present copolymer, the disparity of hydrophilicity and hydrophobicity between polymer molecular chains is small. Accordingly, the copolymer of the present invention is presumed to be good in lithography properties and small in defect notwithstanding that it contains a recurring unit derived from (meth)acrylic acid.

Next, the present invention is further described by way of Examples. However, the present invention is in no way restricted to these Examples. Incidentally, the abbreviations used in the following Examples have the following meanings.

G: a recurring unit derived from γ-butyrolactone methacrylate

Monomer G: γ-butyrolactone methacrylate

Ga: a recurring unit derived from γ-butyrolactone acrylate

Monomer Ga: γ-butyrolactone acrylate

M: a recurring unit derived from 2-methyl-2-adamantyl methacrylate

Monomer M: 2-methyl-2-adamantyl methacrylate

Ma: a recurring unit derived from 2-methyl-2-adamantyl acrylate

Monomer Ma: 2-methyl-2-adamantyl acrylate

O: a recurring unit derived from 3-hydroxy-1-adamantyl methacrylate

Monomer O: 3-hydroxy-1-adamantyl methacrylate

Oa: a recurring unit derived from 3-hydroxy-1-adamantyl acrylate

Monomer Oa: 3-hydroxy-1-adamantyl acrylate

MA: a recurring unit derived from methacrylic acid

AA: a recurring unit derived from acrylic acid

Mw and Mw/Mn of copolymer, proportions of recurring units of copolymer, deprotection degree of copolymer, sensitivity in resist pattern formation, defect and DOF in resist pattern formation were determined according to the following methods.

(1) Measurement of Mw and Mw/Mn of Copolymer by GPC

Measured according to GPC. The analytical conditions were as follows.

Apparatus: GPC 8220 produced by Tosoh Corporation

Detector: a differential refractive index (RI) detector

Columns: KF-804L (three columns) produced by Showa Denko K.K.

Sample: a sample for measurement was prepared by dissolving about 0.1 g of a powdery copolymer in about 1 ml of tetrahydrofuran. The amount of the sample injected into the GPC was 15 μl.

(2) Measurement of Proportions of Recurring Units of Copolymer by $^{13}$C-NMR

Apparatus: AV 400 produced by Bruker

Sample: a sample for measurement was prepared by dissolving about 1 g of a powdery copolymer and 0.1 g of $Cr(acac)_2$ in 1 g of MEK and 1 g of deutrated acetone.

Measurement: a measurement tube of 10 mm in diameter was used; temperature: 40° C.; scanning: 10,000 times (3) Calculation of Proportions of Recurring Units $^{13}$C-NMR measurement was made for a copolymer (Q) synthesized via a step (Q), whose deprotection degree was to be determined, and a copolymer (P) synthesized under the same conditions as for the copolymer (Q) except that no step (Q) was conducted. Then, individual peak areas were determined as follows.

First, for the copolymer (P), using the peak area ($P_N$) of total carbonyl carbon, the peak area ($P_A$) of quaternary carbon of recurring unit (A), the peak area ($P_C$) of the carbon bonded to oxygen other than carbonyl oxygen in lactone bond of recurring unit (C), and the peak area ($P_D$) of the carbon bonded to oxygen other than carbonyl oxygen in ester bond of recurring unit (D), there was determined the peak area $p_I$ of carbonyl carbon derived from polymerization initiator, according to the following equation (1).

$$p_I = (P_N - P_A - P_C - P_D)/\{P_A + (P_C/2) + P_D\} \qquad \text{equation (1)}$$

Then, for the copolymer (Q). Using the peak area ($Q_N$) of total carbonyl carbon, the peak area ($Q_A$) of quaternary carbon of recurring unit (A), the peak area ($Q_C$) of the carbon bonded to oxygen other than carbonyl oxygen in lactone bond of recurring unit (C), and the peak area ($Q_D$) of the carbon bonded to oxygen other than carbonyl oxygen in ester bond of recurring unit (D), there were determined the ratios of recurring units (A), (B), (C) and (D) to the sum of recurring units (A), (C) and (D) of copolymer (Q), i.e. $q_A$, $q_B$, $q_C$ and $q_D$, according to the following equations (2) to (5).

$$q_A = Q_A / \{Q_A + (Q_B/2) + Q_D\} \quad \text{equation (2)}$$

$$q_B = (Q_N - Q_A - Q_C - Q_D) / \{Q_A + (Q_C/2) + Q_D\} - p_I \quad \text{equation (3)}$$

$$q_C = (Q_C/2) / \{Q_A + (Q_C/2) + Q_D\} \quad \text{equation (4)}$$

$$q_D = Q_D / \{Q_A + (Q_C/2) + Q_D\} \quad \text{equation (5)}$$

Further, there were determined the proportions of recurring units (A), (B), (C) and (D) of copolymer (Q), i.e. $q^*_A$, $q^*_B$, $q^*_C$ and $q^*_D$, according to the following equations (6) to (9).

$$q^*_A = q_A / \{q_A + q_B + q_C + q_D\} \quad \text{equation (6)}$$

$$q^*_B = q_B / \{q_A + q_B + q_C + q_D\} \quad \text{equation (7)}$$

$$q^*_C = q_C / \{q_A + q_B + q_C + q_D\} \quad \text{equation (8)}$$

$$q^*_D = q_D / \{q_A + q_B + q_C + q_D\} \quad \text{equation (9)}$$

(4) Evaluation of Sensitivity (Eop)

An organic anti-reflection film composition "ARC-29A" (trade name, a product of Brewer Science Co.) was coated on an 8-inch silicon wafer using a spinner, followed by firing on a hot plate at 205° C. for 60 seconds for drying, to form an organic anti-reflection film of 77 nm in thickness. On the anti-reflection film was coated a solution of a positive resist composition solution using a spinner, followed by prebaking (PAB) on a hotplate at 105° C. for 90 seconds for drying, to form a resist film of 220 nm in thickness.

Using an ArF exposure system NSR-S306 (a product of Nikon Corporation, NA (number of aperture)=0.78, ½ annular illumination), the resist film was irradiated with an ArF excimer laser beam (193 nm) selectively via a mask pattern (6% half tone). Then, a PEB treatment was conducted at 110° C. for 90 seconds, puddle development was conducted at 23° C. for 60 seconds using a 2.38 mass % aqueous tetramethylammonium hydroxide solution, washing with water was conducted for 20 seconds, followed by drying.

There was determined an optimum exposure $E_{op}$ (mJ/cm$^2$) at which a contact hole pattern having a diameter of 100 nm and a pitch of 220 nm was formed.

(5) Evaluation of Width of Depth of Focus (DOF)

In the above Eop, the focus was appropriately shifted vertically, whereby was determined a width (μm) of depth of focus (DOF) at which the above contact hole pattern could be obtained in a range of diameter change of 100 nm±10%.

(6) Evaluation of Defect

A solution of a positive resist composition was coated on an 8-inch silicon wafer subjected to a hexamethyldisilazane (HMDS) treatment, directly using a spinner, followed by prebaking (PAB) on a hot plate at 105° C. for 90 seconds for drying, to obtain a resist film of 220 nm in thickness.

Using an ArF exposure system NSR-S306 (a product of Nikon Corporation, NA (number of aperture)=0.78, σ=0.30), the resist film was irradiated with an ArF excimer laser beam (193 nm) selectively via a mask pattern (binary). Then, a PEB treatment was conducted at 110° C. for 90 seconds, puddle development was conducted at 23° C. for 60 seconds using a 2.38 mass % aqueous tetramethylammonium hydroxide solution, a rinsing solution was dropped under the conditions of 1,000 rpm for 1 second and 500 rpm for 15 seconds (the forced conditions under which defect generation was easy), followed by drying, to form a resist pattern. The pattern was a dense hole pattern in which holes of 300 nm in diameter were arranged at intervals of 300 nm.

Next, the number of defects in wafer was measured using a surface defect observation apparatus KLA 2351 (product name) produced by KLA Tencor).

The same evaluation was repeated once more and an average of the defect numbers of two wafers was determined.

EXAMPLE 1

In a container purged with nitrogen were placed 1,080 g of methyl ethyl ketone (MEK), 50 g of a MEK solution containing 28 mg of sulfuric acid, 352 g of monomer Ma (A), 265 g of monomer G (C) and 186 g of monomer Oa (D), and a homogeneous monomers solution was prepared. In a separate container purged with nitrogen were placed 52 g of MEK and 26 g of dimethyl 2,2'-azobisiso-butyrate (MAIB), and a homogeneous initiator solution was prepared. 680 g of MEK was fed into a reactor fitted with a stirrer and a cooler, the reactor was purged with nitrogen, and the reactor contents were heated to 79° C. The monomers solution and the initiator solution each kept at room temperature (about 25° C.) were independently added dropwise into the reactor kept at 79 to 81° C., at a given rate in 4 hours, using respective metering pumps. After the completion of the dropwise addition, the resulting mixture was aged for 2 hours at 80 to 81° C. and then cooled to room temperature, and the polymer solution was taken out.

8,100 g of n-hexane was placed in a 20-liter container, cooled to 15° C. with stirring and kept at that state. Thereto was dropwise added 2,700 g of the polymer solution to separate out a copolymer. Stirring was made for a further 30 minutes, after which filtration was made to collect a wet cake. This wet cake was returned to the container and 5,400 g of a mixed solvent of n-hexane and MEK was added thereto, followed by 30-minutes stirring, washing and filtration. The resulting wet cake was washed once more. Then, a small amount of a sample was taken from the wet cake and dried under reduced pressure at 60° C. or less for 1 hour to obtain a dried powder. The dried powder was measured for Mw and Mw/Mn by GPC and determined for proportions of recurring units by $^{13}$C-NMR. The remaining wet cake was returned to the container and re-dissolved in 2,000 g of MEK. Then, the resulting solution was fed into a substitution tank provided with a stirrer and a cooler. While the solution was subjected to distillation with heating under reduced pressure, to remove the solvent, and PGMEA was added into the tank. After the completion of PGMEA addition, a given amount of PGMEA was removed by distillation, to obtain a PGMEA solution containing 25% by mass of a copolymer.

Necessary additives were added to the obtained PGMEA solution, followed by mixing. The resulting mixture was filtered to obtain a resist composition. This resist composition was evaluated for sensitivity (Eop), defect and DOF according to the above-mentioned methods. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

EXAMPLE 2

An operation was conducted in the same manner as in Example 1 except that the use amount of sulfuric acid was changed to 34 mg. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

EXAMPLE 3

An operation was conducted in the same manner as in Example 1 except that the use amount of sulfuric acid was changed to 39 mg. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

EXAMPLE 4

An operation was conducted in the same manner as in Example 1 except that there were used, for preparation of a monomers solution, 384 g of monomer M (A), 250 g of monomer Ga (C), 179 g of monomer O (D) and 31 mg of sulfuric acid and, for preparation of an initiator solution, 64 g of MEK and 32 g of MAIB. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

EXAMPLE 5

An operation was conducted in the same manner as in Example 1 except that 390 mg of trifluoroacetic acid (TFA) was used in place of sulfuric acid. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

COMPARATIVE EXAMPLE 1

An operation was conducted in the same manner as in Example 1 except that no sulfuric acid was used. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

COMPARATIVE EXAMPLE 2

An operation was conducted in the same manner as in Example 1 except that no sulfuric acid was used, 11.5 g of acrylic acid was added as a new monomer, and the use amount of monomer Ma (A) was changed to 317 g. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

COMPARATIVE EXAMPLE 3

An operation was conducted in the same manner as in Comparative Example 2 except that the addition amount of acrylic acid was changed to 17.3 g and the use amount of monomer Ma (A) was changed to 299 g. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

COMPARATIVE EXAMPLE 4

An operation was conducted in the same manner as in Example 4 except that no sulfuric acid was used. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

COMPARATIVE EXAMPLE 5

An operation was conducted in the same manner as in Example 4 except that no sulfuric acid was used, 13.8 g of methacrylic acid was added as a new monomer, and the use amount of monomer M was changed to 347 g. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

COMPARATIVE EXAMPLE 6

An operation was conducted in the same manner as in Example 1 except that 560 mg of chloroacetic acid (CAA)

was used in place of sulfuric acid. There are shown, in Table 1, the kind of the strong acid used in the step (Q) of copolymer production, the concentration (mass ppm) of the strong acid in the reaction system, and the measurement results of the Mw, Mw/Mn and proportions of recurring units, of the copolymer obtained. Also, there are shown, in Table 2, the proportions of individual components in the resist composition and the evaluation results of sensitivity (Eop), defect and DOF.

pKa of 2.88 in water at 25° C. was large in number of defects and, therefore, other items were not evaluated for this Comparative Example.

INDUSTRIAL APPLICABILITY

With the copolymer of the present invention, a resist pattern can be formed which is small in development defects and superior in lithography properties such as DOF and the like.

TABLE 1

| | Strong acid | | GPC | | Proportions of recurring units (mol %) | | | | | | | |
|---|---|---|---|---|---|---|---|---|---|---|---|---|
| | Kind | Conc. (ppm) | Mw | Mw/Mn | G | Ga | M | Ma | O | Oa | MA | AA |
| Ex. 1 | Sulfuric acid | 10 | 10,350 | 2.17 | 40.5 | | | 34.9 | | 21.0 | | 3.6 |
| Ex. 2 | Sulfuric acid | 12 | 9,980 | 2.17 | 40.5 | | | 34.2 | | 21.2 | | 4.1 |
| Ex. 3 | Sulfuric acid | 14 | 9,970 | 2.14 | 40.8 | | | 32.7 | | 21.3 | | 5.2 |
| Ex. 4 | Sulfuric acid | 11 | 10,280 | 2.02 | | 40.3 | 35.1 | | 20.1 | | 4.5 | |
| Ex. 5 | TFA | 140 | 10,150 | 2.11 | 40.5 | | | 33.6 | | 21.1 | | 4.8 |
| Comp. Ex. 1 | — | — | 9,990 | 2.14 | 40.0 | | | 38.9 | | 21.1 | | 0.0 |
| Comp. Ex. 2 | — | — | 10,210 | 2.21 | 40.2 | | | 35.3 | | 21.1 | | 3.4 |
| Comp. Ex. 3 | — | — | 10,400 | 2.20 | 40.3 | | | 33.5 | | 21.3 | | 4.9 |
| Comp. Ex. 4 | — | — | 11,320 | 2.03 | | 38.8 | 41.4 | | 19.8 | | 0.0 | |
| Comp. Ex. 5 | — | — | 10,560 | 2.11 | | 39.2 | 37.1 | | 19.7 | | 4.0 | |
| Comp. Ex. 6 | CAA | 200 | 10,120 | 2.17 | 40.2 | | | 38.7 | | 21.1 | | 0.0 |

TABLE 2

| | Copolymer (mass parts) | Component (X) (mass parts) | Component (Y) (mass parts) | Component (Z) (mass parts) | Resist solvent (mass parts) | Eop (mJ/cm$^2$) | DOF (μm) | Defect (number) |
|---|---|---|---|---|---|---|---|---|
| Ex. 1 | 100 | 3.5 | 0.1 | — | 750 | 23.0 | 4.0 | 1698 |
| Ex. 2 | 100 | 3.5 | 0.1 | — | 750 | 22.0 | 4.0 | 442 |
| Ex. 3 | 100 | 3.5 | 0.1 | — | 750 | 21.5 | 4.0 | 376 |
| Ex. 4 | 100 | 3.5 | 0.1 | 0.1 | 750 | 23.0 | 4.0 | 150 |
| Ex. 5 | 100 | 3.5 | 0.1 | — | 750 | 22.0 | 4.0 | 400 |
| Comp. Ex. 1 | 100 | 3.5 | 0.1 | — | 750 | — | — | 67000 |
| Comp. Ex. 2 | 100 | 3.5 | 0.1 | — | 750 | — | — | 11294 |
| Comp. Ex. 3 | 100 | 3.5 | 0.1 | — | 750 | 20.5 | 3.0 | 442 |
| Comp. Ex. 4 | 100 | 3.5 | 0.1 | 0.1 | 750 | 29.0 | 2.5 | 45900 |
| Comp. Ex. 5 | 100 | 3.5 | 0.1 | 0.1 | 750 | 27.0 | 3.5 | 47351 |
| Comp. Ex. 6 | 100 | 3.5 | 0.1 | — | 750 | — | — | 59900 |

Component (X): 4-methylphenyldiphenylsulfonium nonafluorobutanesulfonate
Component (Y): triethanolamine
Component (Z): salicylic acid
Resist solvent: a mixed solvent [PGMEA:EL = 6:4 (mass ratio)]

As described above, Examples 1 to 5 each using a copolymer produced via the step (Q) were each good in lithography properties (e.g. large DOF) and also small in number of defects.

In contrast, Comparative Examples 1 to 6 each using a copolymer produced without the step (Q) were insufficient in lithography properties, particularly in DOF. Comparative Examples 1, 2 and 6 were large in number of defects and, therefore, other items were not evaluated for these Comparative Examples. Of Comparative Examples 2 and 3 each using a copolymer containing a recurring unit (B) derived from acrylic acid, Comparative Example 3, in particular, was small in number of defects but insufficient in DOF. Comparative Example 5 using a copolymer containing a recurring unit (B) derived from methacrylic acid was large in number of defects, insufficient in DOF and low in sensitivity. Comparative Example 6 using, in the step (Q), chloroacetic acid having a

What is claimed is:

1. A copolymer for semiconductor lithography, comprising at least a recurring unit (A) having a carboxylic acid ester structure whose solubility in alkali increases by the action of an acid and a carboxyl group-containing recurring unit (B), which copolymer is obtained via a step (P) of (co)polymerizing at least a monomer giving a recurring unit (A) and a step (Q) of forming a recurring unit (B) by conducting partial deprotection of the protective group of the carboxylic acid ester structure in the recurring unit (A), in the co-presence of a recurring unit (A)-containing (co)polymer and/or a monomer giving a recurring unit (A), and an acid having a pKa of preferably 2.0 or less in water at 25° C.

2. The copolymer for semiconductor lithography defined in claim 1, which comprises a recurring unit (C) having a lactone structure.

3. The copolymer for semiconductor lithography defined in claim 1, which comprises a recurring unit (D) having a carboxylic acid ester structure substituted with an acid-stable, alicyclic hydrocarbon group.

4. The copolymer for semiconductor lithography defined in claim 1, wherein the recurring unit (A) is represented at least by the following general formula (a):

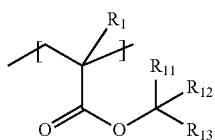

[general formula (a)]

(wherein R is a hydrogen atom or a hydrocarbon group having 1 to 4 carbon atoms; $R_{11}$ is a hydrocarbon group having 1 to 4 carbon atoms; $R_{12}$ and $R_{13}$ are each independently a straight chain or branched chain hydrocarbon group having 1 to 12 carbon atoms, or an alicyclic hydrocarbon group of single ring or bridge-containing ring, or, $R_{12}$ and $R_{13}$ bond to each other to form an alicyclic hydrocarbon group of single ring or bridge-containing ring, having 5 to 12 carbon atoms; or, $R_{11}$ and $R_{12}$ are each a hydrogen atom or a hydrocarbon group having 1 to 4 carbon atoms, and $R_{13}$ is an oxy group substituted with a straight chain or branched chain hydrocarbon group having 1 to 12 carbon atoms or with an alicyclic hydrocarbon group of single ring or bridge-containing ring).

5. The copolymer for semiconductor lithography defined in claim 1, wherein the recurring unit (B) is represented at least by the following general formula (b):

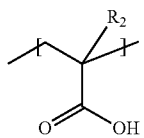

[general formula (b)]

(wherein R2 is a hydrogen atom or a hydrocarbon group having 1 to 4 carbon atoms).

6. The copolymer for semiconductor lithography deined in claim 1, wherein the recurring unit (C) is represented at least by the following general formula (c):

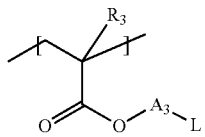

[general formula (c)]

(wherein $R_3$ is a hydrogen atom or a hydrocarbon group having 1 to 4 carbon atoms; $A_3$ is a single bond, or an alicyclic hydrocarbon group of single ring or bridge-containing ring, having 5 to 12 carbon atoms; L is a lactone structure represented by the following general formula (L); $A_3$ and L bond to each other via one or two connecting bonds:

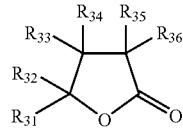

[general formula (L)]

(wherein any one or two of $R_{31}$ to $R_{36}$ are connecting bonds to $A_3$ of the general formula (c) and the remainder is each a hydrogen atom or a hydrocarbon or alkoxyl group having 1 to 4 carbon atoms).

7. The copolymer for semiconductor lithography defined in claim 1, wherein the recurring unit (D) is represented at least by the following general formula (d):

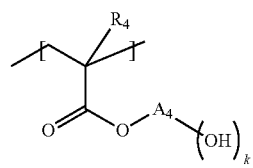

[general formula (d)]

(wherein $R_4$ is a hydrogen atom or a hydrocarbon group having 1 to 4 carbon atoms; $A_4$ is an alicyclic hydrocarbon group having a bridge-containing ring of 7 to 12 carbon atoms, which may be substituted with halogen atom; and k is an integer of 0 to 3).

8. The copolymer for semiconductor lithography defined in claim 1, which is obtained by conducting the step (P) and the step (Q) simultaneously.

9. The copolymer for semiconductor lithography defined in claim 1, which is obtained by conducting the step (Q) after the step (P).

10. A process for producing a copolymer for semiconductor lithography comprising at least a recurring unit (A) having a carboxylic acid ester structure whose solubility in alkali increases by the action of an acid and a carboxyl group-containing recurring unit (B), which process includes a step (P) of (co)polymerizing at least a monomer giving a recurring unit (A) and a step (Q) of forming a recurring unit (B) by conducting partial deprotection of the protective group of the carboxylic acid ester structure in the recurring unit (A) in the co-presence of a recurring unit (A)-containing (co)polymer and/or a monomer giving a recurring unit (A), and an acid having a pKa of preferably 2 0 or less in water at 25° C.

11. The process for producing a copolymer fr semiconductor lithography defined in claim 10, wherein the copolymer comprises a recurring unit (C) having a lactone structure.

12. The process for producing a copolymer for semiconductor lithography defined in claim 10, wherein the copolymer comprises a recurring unit (D) having a carboxylic acid ester structure substituted with an acid-stable, alicyclic hydrocarbon group.

13. The process for producing a copolymer for semiconductor lithography defined in claim 10, wherein the recurring unit (A) is represented at least by the following general formula (a):

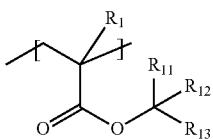

[general formula (a)]

(wherein $R_1$ is a hydrogen atom or a hydrocarbon group having 1 to 4 carbon atoms; $R_{11}$ is a hydrocarbon group having 1 to 4 carbon atoms; $R_{12}$ and $R_{13}$ are each independently a straight chain or branched chain hydrocarbon group having 1 to 12 carbon atoms, or an alicyclic hydrocarbon group of single ring or bridge-containing ring, or, $R_{12}$ and $R_{13}$ bond to each other to form an alicyclic hydrocarbon group of single ring or bridge-containing ring, having 5 to 12 carbon atoms; or, $R_{11}$ and $R_{12}$ are each a hydrogen atom or a hydrocarbon group having 1 to 4 carbon atoms, and $R_3$ is an oxy group substituted with a straight chain or branched chain hydrocarbon group having 1 to 12 carbon atoms or with an alicyclic hydrocarbon group of single ring or bridge-containing ring).

14. The process for producing a copolymer for semiconductor lithography defined in claim 10, wherein the recurring unit (B) is represented at least by the following general formula (b):

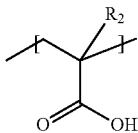

[general formula (b)]

(wherein $R_2$ is a hydrogen atom or a hydrocarbon group having 1 to 4 carbon atoms).

15. The process for producing a copolymer for semiconductor lithography defined in claim 10, wherein the recurring unit (C) is represented at least by the following general formula (c):

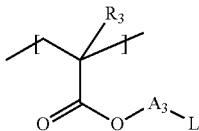

[general formula (c)]

(wherein $R_{b\,3}$ is a hydrogen atom or a hydrocarbon group having 1 to 4 carbon atoms; $A_3$ is a single bond, or an alicyclic hydrocarbon group of single ring or bridge-containing ring, having 5 to 12 carbon atoms; L is a lactone structure represented by the following general formula (L); $A_3$ and L bond to each other via one or two connecting bonds:

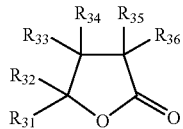

[general formula (L)]

(wherein any one or two of $R_{31}$ to $R_{36}$ are connecting bonds to $A_3$ of the general formula (c) and the remainder is each a hydrogen atom or a hydrocarbon or alkoxyl group having 1 to 4 carbon atoms).

16. The process for producing a copolymer for semiconductor lithography defined in claim 10, wherein the recurring unit (D) is represented at least by the following general formula (d):

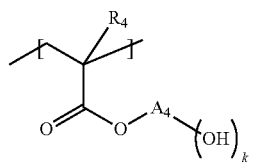

[general formula (d)]

(wherein $R_4$ is a hydrogen atom or a hydrocarbon group having 1 to 4 carbon atoms; $A_4$ is an alicyclic hydrocarbon group having a bridge-containing ring of 7 to 12 carbon atoms, which may be substituted with halogen atom; and k is an integer of 0 to 3).

17. The process for producing a copolymer for semiconductor lithography defined in claim 10, wherein the step (P) and the step (Q) are conducted simultaneously.

18. The process for producing a copolymer for semiconductor lithography defined in claim 10, wherein the step (Q) is conducted after the step (P).

* * * * *